United States Patent
Park et al.

(10) Patent No.: US 7,558,993 B2
(45) Date of Patent: Jul. 7, 2009

(54) TEST APPARATUS FOR SEMICONDUCTOR MEMORY DEVICE

(75) Inventors: Cheol-Hong Park, Seoul (KR); Sang-Seok Kang, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 598 days.

(21) Appl. No.: 11/273,527

(22) Filed: Nov. 15, 2005

(65) Prior Publication Data

US 2006/0107134 A1 May 18, 2006

(30) Foreign Application Priority Data

Nov. 16, 2004 (KR) ............ 10-2004-0093731

(51) Int. Cl.
*G11C 29/00* (2006.01)
*G11C 7/00* (2006.01)
*G01R 31/28* (2006.01)

(52) U.S. Cl. ............ 714/722; 714/736; 365/201

(58) Field of Classification Search ............ 714/736, 714/718, 719, 722; 365/200–201
See application file for complete search history.

(56) References Cited

U.S. PATENT DOCUMENTS 5,682,390 A * 10/1997 Housako et al. ............ 714/720
5,903,576 A    5/1999 Yoshiba
6,189,121 B1 * 2/2001 Ogawa ............ 714/733
7,259,606 B2 * 8/2007 Ku et al. ............ 327/235
7,266,738 B2 * 9/2007 Sato ............ 714/718

FOREIGN PATENT DOCUMENTS

| JP | 09166646 A | * | 6/1997 |
| JP | 11202026 A | * | 7/1999 |
| JP | 2002-196053 |   | 7/2002 |
| KR | 10-1998-0003624 |   | 3/1998 |

OTHER PUBLICATIONS

"Self-learning signature analysis for non-volatile memory testing" by Olivo et al. This paper appears in: Test Conference, 1996. Proceedings., International Publication Date: Oct. 20-25, 1996 On pp. 303-308 ISBN: 0-7803-3541-4 INSPEC Accession No. 5539857.*

* cited by examiner

*Primary Examiner*—Cynthia Britt
(74) *Attorney, Agent, or Firm*—Volentine & Whitt, P.L.L.C.

(57) ABSTRACT

A test apparatus for a semiconductor memory device applies a test input pattern to the semiconductor memory device to produce a test output pattern. The test apparatus compares the test output pattern to an expected output pattern using a plurality of comparators to determine whether the semiconductor memory device is defective. The plurality of comparators are respectively controlled by a respective plurality of strobe signals having relative phase delays so that the test output pattern is compared to the expected output pattern at different times.

19 Claims, 6 Drawing Sheets

TEST APPARATUS FOR SEMICONDUCTOR MEMORY DEVICE

BACKGROUND OF THE INVENTION

1. Field of the Invention

The present invention relates generally to a test apparatus for a semiconductor memory device. More particularly, the invention relates to a test apparatus adapted to detect defects in a semiconductor memory device whose output timing varies according to various operating conditions of the device.

A claim of priority is made to Korean Patent Application No. 10-2004-0093731, filed Nov.16, 2004, the disclosure of which is hereby incorporated by reference in its entirety.

2. Description of Related Art

A semiconductor memory device is typically tested by applying a test input pattern to the device and determining whether a resulting test output pattern matches an expected output pattern. Where the semiconductor memory device is defective, the test output pattern will not match the expected output pattern.

The term "test input pattern" here refers to a set of electrical input signals applied to the device, the term "test output pattern" refers to a set of electrical output signals produced by the device in response to the input signals, and the term "expected output pattern" denotes a set of reference electrical signals used to determine whether the test output pattern is acceptable.

The test input pattern and the expected output pattern are produced by a test apparatus. The test apparatus applies the test input pattern to the semiconductor memory device, and then compares the resulting test output pattern to the expected output pattern. To properly capture the test output pattern from the device, the test apparatus must sample the test output pattern according to the output timing of the semiconductor memory device. However, the output timing of the semiconductor memory device tends to vary according to various operating conditions of the device, such as its power supply voltage.

FIG. 1 shows a timing diagram for a semiconductor memory device operating under different power supply voltages. Referring to FIG. 1, the test input pattern is applied to the semiconductor memory device at a time 0.0s and the test output pattern is produced at times indicated by asterisks (*). The range of time over which data is output from the device, while operating at a particular power supply voltage, is called a "data generating region." Data generation regions can be seen in FIG. 1 as the time periods between the first and last asterisks in each row. In FIG. 1, time is represented on the x-axis and the power supply voltage is represented on the y-axis.

As shown in FIG. 1, when the power supply voltage is increased, the device experiences a larger delay before the data generating region. For example, when the semiconductor memory device uses a power supply voltage of 2.1V, the semiconductor memory device outputs data from about 0.4 ns to about 1.5 ns. However, when using a power supply voltage of 3.9V, the semiconductor memory device outputs data from about 1.4 ns to about 2.5 ns.

While not shown, the width of the data generating region becomes smaller as the operating speed of the semiconductor memory device increases. In addition, the data generating region of the semiconductor memory device can also vary based on other conditions related to the device and its environment.

Conventional test apparatuses use strobe signals to sample the test output pattern produced by the semiconductor memory device. For instance, a comparator in the test apparatus may receive the test output pattern through a latch controlled by a strobe signal, where the latch receives the test output pattern only when the strobe signal is activated.

Because the data generation region of a semiconductor memory device can vary based on the device's operating conditions, conventional test apparatuses generally perform multiple independent trials with strobe signals having relative phase delays to ensure that the test output pattern is sampled at the right time. For example, the test apparatus may repeatedly input the test input pattern to the semiconductor device and sample the resulting test output pattern using a different strobe signal each time. If the test output pattern does not match the expected output pattern in any of the trials, the semiconductor memory device has a defect. Otherwise, if the test output pattern matches the expected output pattern in one of the trials, then the semiconductor memory device is acceptable (i.e., not defective).

FIG. 2 is a block diagram of a conventional test apparatus 1. Referring to FIG. 2, test apparatus 1 comprises a pattern generator 11, a timing generator 12, a controller 13, a driver 14, a comparator 15, and an operation determiner 16.

Pattern generator 11 generates a test input pattern and an expected output pattern for a semiconductor memory device 2. The test input pattern is applied to semiconductor memory device 2 through driver 14 under the control of controller 13, and semiconductor memory device 2 processes the test input pattern to produce a test output pattern. The term "process" here refers to any operation performed by semiconductor memory device 2 based on the test input pattern. The operation does not necessarily have to modify the test input pattern and the test output pattern does not necessarily have to be a derivative of the test input pattern per se.

Timing generator 12 generates timing signals used to control the timing of the test input pattern and a plurality of strobe signals. Timing generator 12 generates the timing signals based on timing information of the semiconductor memory device, such as its operating frequency, access time, setup and hold times, and so on. The strobe signals are driven so that they have relative phase delays from each other. In other words, the strobe signals are activated at different times.

Controller 13 transfers the expected output pattern from pattern generator 11 to comparator 15 and then, as semiconductor memory device 2 produces the test output pattern, one of the strobe signals is activated to transfer the test output pattern to comparator 15, and comparator 15 then compares the test output pattern to the expected output pattern to determine whether semiconductor memory device 2 is acceptable.

Upon comparing the expected output pattern to the test output pattern, comparator 15 generates a comparative value. A "comparative value" is an electrical signal whose logic state indicates whether the comparison determined two sets of data to be similar or dissimilar. For instance, where the expected output pattern and the test output pattern are different, comparator 15 generates the comparative value with a logic state indicating dissimilarity (e.g., a logical '0'). Otherwise, comparator 351 generates the comparative value with a logic state indicating similarity (e.g., a logical '1').

Comparator 15 generates a comparative value each time it compares the expected output data to the test output data. In other words, comparator 15 generates a comparative value each time a new strobe signal is activated. Each successive comparative value is transferred to operation determiner 16, which analyzes the comparative value to determine whether semiconductor memory device 2 is acceptable. Upon determining that semiconductor memory device 2 is acceptable, operation determiner 16 informs controller 13.

Controller 13 uses the timing signals generated by timing generator 12 to "structure" the test input pattern and the strobe signals when respectively applying these signals to driver 14 and comparator 15. The term "structure" here refers to the process of establishing proper timing and timing relationships for the test input pattern and the strobe signals. In other words, controller 13 outputs the test pattern signals and the strobe signals according to the timing signals.

Because the conventional apparatus uses a single comparator connected to a single pin in semiconductor memory device 2, it has to send the test input data to semiconductor memory device 2 every time a new strobe signal is used to sample the test output data. As a result, the time required to test semiconductor memory device increases proportional to the number of strobe signals used in the test.

SUMMARY OF THE INVENTION

According to one embodiment of the present invention, a test apparatus for a semiconductor memory device comprises a comparison unit adapted to generate a logically summed comparative value by logically summing a plurality of comparative values produced by comparing a test output pattern produced by the semiconductor memory device to an expected output pattern generated by the test apparatus, wherein the comparison produces the comparative values in response to a respective plurality of strobe signals. The test apparatus further comprises a controller adapted to structure the plurality of strobe signals and transmit the plurality of strobe signals to the comparison unit, and further adapted to analyze the logically summed comparative value to determine whether the semiconductor memory device is defective.

According to another embodiment of the invention, a test apparatus for a semiconductor memory device comprises a comparison unit adapted to generate a logically summed comparative value by logically summing a plurality of comparative values produced by comparing a test output pattern produced by the semiconductor memory device to an expected output pattern generated by the test apparatus, wherein the comparison produces the comparative values in response to a respective plurality of strobe signals. The test apparatus further comprises a phase delay unit adapted to store strobe information, including the number of strobe signals in the plurality of strobe signals, and relative phase delay information for the plurality of strobe signals, and generating the strobe signals based on the strobe information. The test apparatus still further comprises a controller adapted to structure the plurality of strobe signals and transmit the plurality of strobe signals to the comparison unit, and further adapted to analyze the logically summed comparative value to determine whether the semiconductor memory device is defective.

BRIEF DESCRIPTION OF THE DRAWINGS

The invention is described below in relation to several embodiments illustrated in the accompanying drawings. Throughout the drawings like reference numbers indicate like exemplary elements, components, or steps and the thickness of layers and regions has been exaggerated for clarity. In the drawings.

DESCRPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
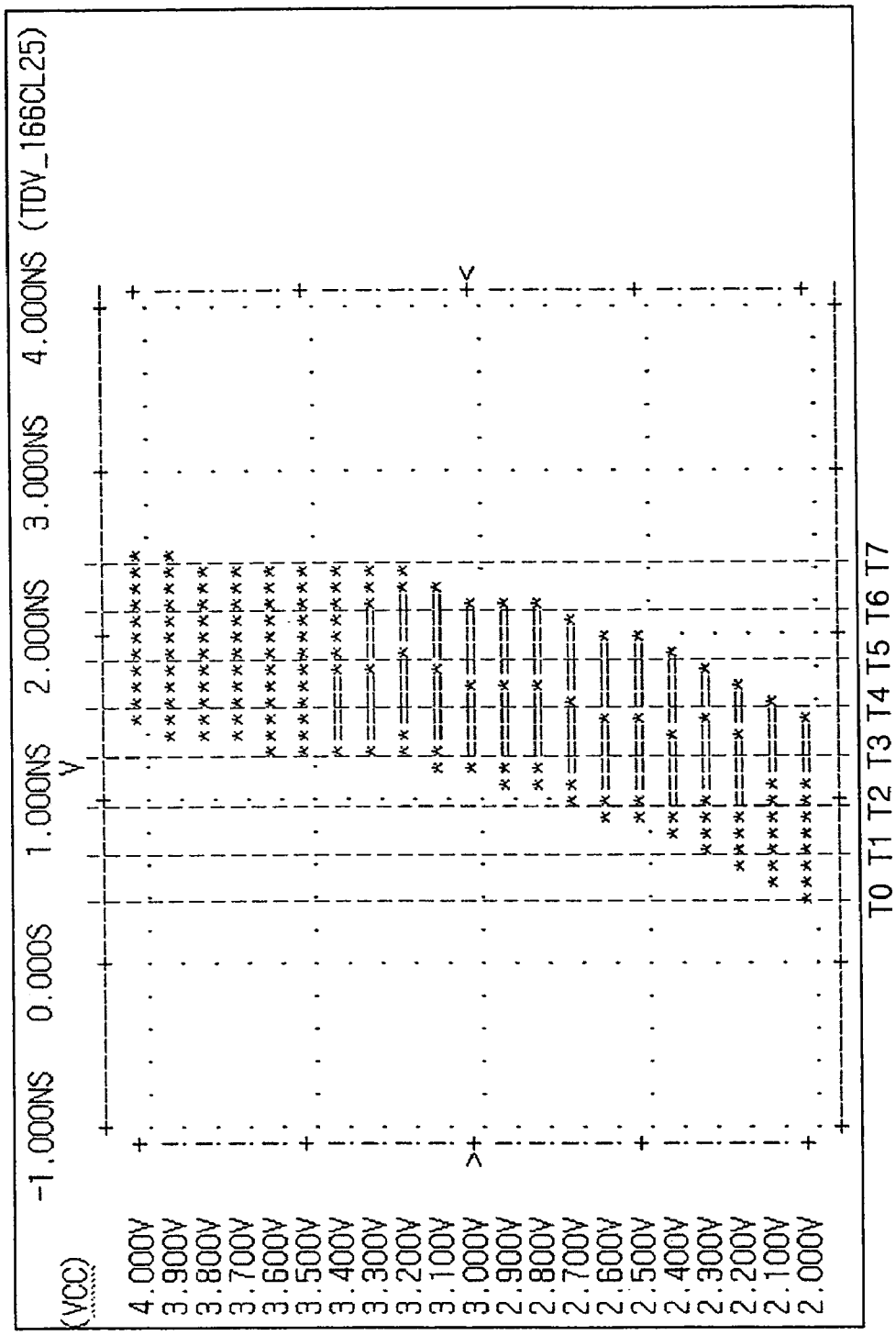
FIG. 1 shows a timing diagram for a semiconductor memory device operating under different power supply voltages.
Figure 2:
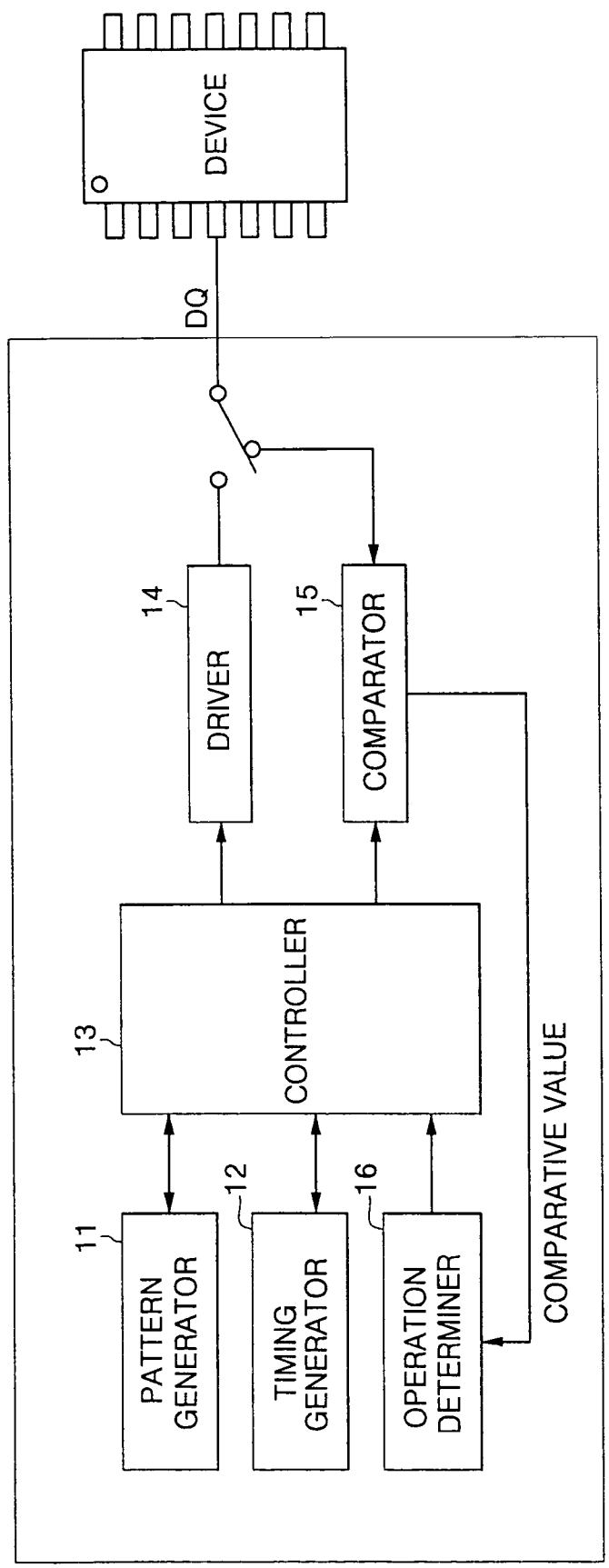
FIG. 2 is an block diagram of a conventional test apparatus for a semiconductor memory device.
Figure 3:
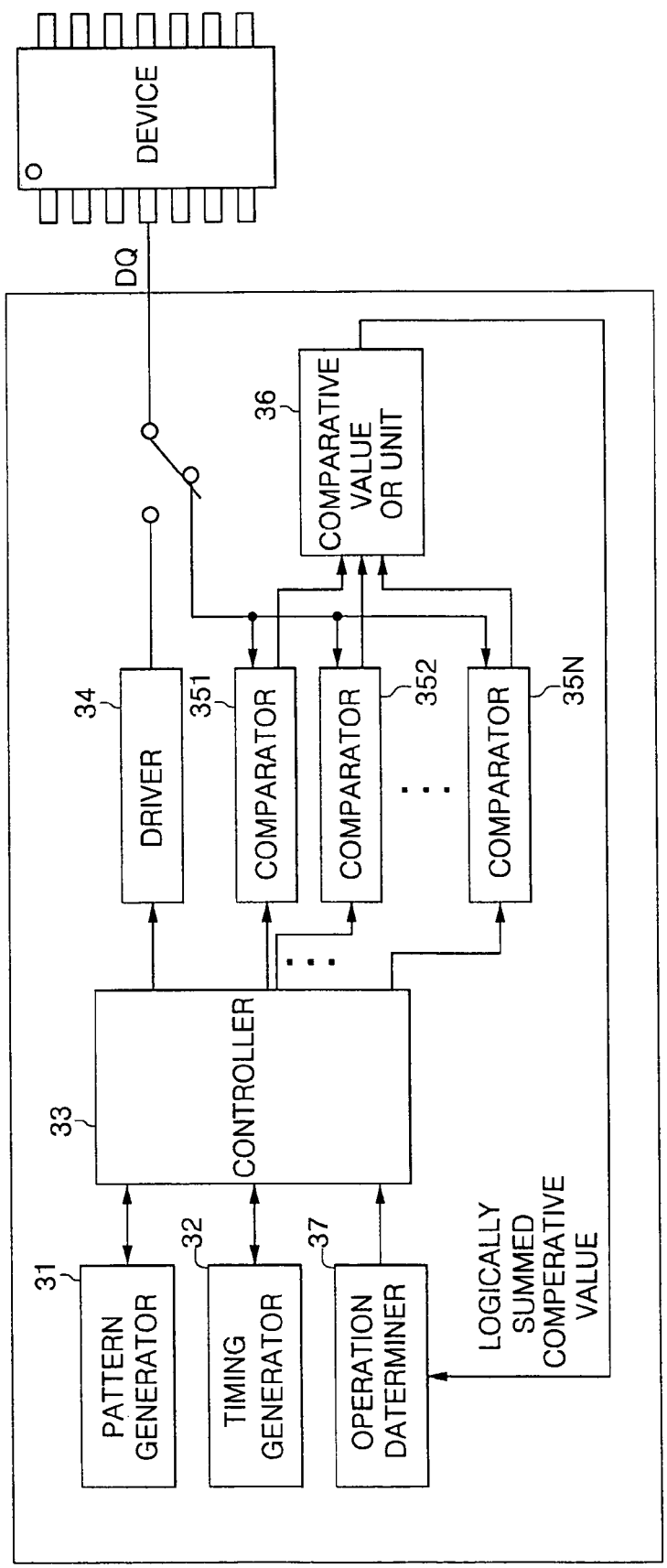
FIG. 3 is a block diagram of a test apparatus according to one embodiment of the present invention.

FIG. 3 is a block diagram of a test apparatus 3 according to one embodiment of the present invention.

Referring to FIG. 3, test apparatus 3 comprises a pattern generator 31, a timing generator 32, a controller 33, a driver 34, a plurality of comparators 351 through 35N, a comparative value OR unit 36, and an operation determiner 37. Together, comparators 351 through 35N and comparative value OR unit constitute a "comparison unit."

Pattern generator 31 generates an input test pattern and an expected output pattern for a semiconductor memory device 2. The input test pattern is applied to semiconductor memory device 2 to produce a test output pattern and the expected output pattern is transferred to plurality of comparators 351 through 35N.

Timing generator 32 generates timing signals to control the timing of the test input pattern. It generates the timing signals based on timing information about semiconductor memory device 2, such as its operating frequency, access time, setup and hold times, and so on. The timing signals are used to drive the electrical signals in the test input pattern. In addition, timing generator 32 also generates timing signals for driving a plurality of strobe signals strobe1 through strobeN having different phase delays from each other.

Timing generator 32 stores the timing information for semiconductor memory device 2 and it also stores timing information about strobe signals strobe1 through strobeN. The information about strobe signals strobe1 through strobeN may include, for example, the number of strobe signals used for a particular trial, and their respective phase delays. The timing information for strobe signals strobe1 through strobeN and semiconductor memory device 2 can be updated according to the specifications of different trials.

Controller 33 provides the expected output pattern produced by pattern generator 31 to comparators 351 through 35N. At the same time, controller 33 provides strobe signals strobe1 through strobeN to respective comparators 351 through 35N to sample the test output pattern from semiconductor memory device 2.

Controller 33 structures the input test pattern and strobe signals strobe1 through strobeN based on the timing signals generated by timing generator 32. Controller 33 applies the test input pattern to driver 34 while applying strobe signals strobe1 through strobeN and the expected output pattern to respective comparators 351 through 35N. Driver 34 in turn applies the test input pattern to pins on semiconductor memory device 2 and semiconductor memory device 2 processes the test input pattern to produce the test output pattern.

Comparators 351 through 35N are connected to a pin or pins of semiconductor memory device to receive the test output pattern. Comparators 351 through 35N each compare the test output pattern with the expected output pattern. However, since strobe signals strobe1 through strobeN have different phase delays, the comparisons take place at different times. Each of comparators 351 through 35N produces and outputs a comparative value in response to the comparisons.

The respective comparative values output by comparators 351 through 35N are input to comparative value OR unit 36. Comparative value OR unit 36 performs an OR operation on the comparative values to determine whether semiconductor memory device 2 is defective or not. Where semiconductor memory device 2 is not defective, at least one of the comparative values will be a logical '1', and therefore comparative value OR unit 36 will output a logical '1'. Otherwise, all of the comparative values will be logical '0' and comparative value OR unit 36 will output a logical '0'.

Operation determiner 37 receives the output of comparative value OR unit 36 and whether semiconductor memory device 2 has defects. Operation determiner 37 in turn informs controller 33 whether semiconductor memory device 2 has defects and controller 33 sends a signal to a display (not shown) to visually or audibly indicate the result.

An exemplary operation of one of comparators 351 through 35N can be explained as follows. Suppose comparator 351 receives a logical '1' as the expected output pattern from controller 33, and the test output pattern sampled according to the timing of strobe signal strobe1 also comprises a logical '1'. Comparator 351 then outputs a logical '1' to indicate that semiconductor memory device 2 operates normally.

On the other hand, if the test output pattern from semiconductor memory device 2 is a logical '0' or a high impedance (Hi-z) signal while the expected output pattern is a logical '1', comparator 351 outputs a logical '0' to indicate that semiconductor memory device 2 does not necessarily operate normally.

Figure 4:
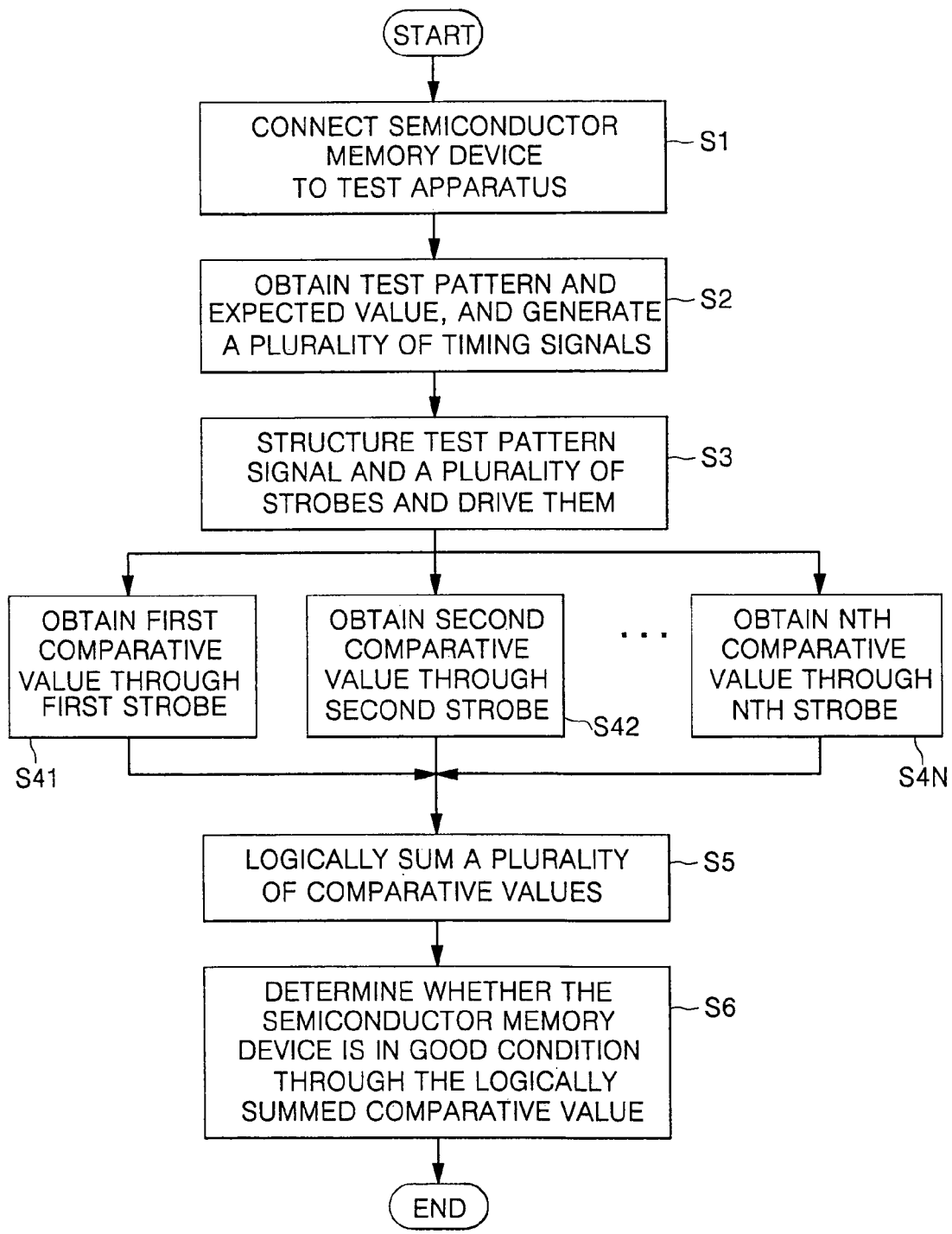
FIG. 4 is a flow chart illustrating a method of testing a semiconductor memory device using the test apparatus shown in FIG. 3.

FIG. 4 is a flow chart illustrating a method of testing a semiconductor memory device using the test apparatus shown in FIG. 3. In this written description, exemplary method steps are denoted by parentheses (XXX) to distinguish them from exemplary apparatus elements such as those shown in FIG. 3.

Referring to FIG. 4, semiconductor memory device 2 is electrically connected to test apparatus 3 (S1). This is accomplished by connecting the pins of semiconductor memory device 2 that will receive the test input pattern, to driver 34, and connecting the pins of the semiconductor memory device 2 that will output the test output pattern to comparators 351 to 35N.

Once semiconductor memory device 2 is electrically connected to test apparatus 3, pattern generator 31 generates the input test pattern and the expected output pattern used to test semiconductor memory device 2. At the same time, timing generator 32 generates timing signals for controlling the timing of strobe signals strobe1 through strobeN (S2).

Controller 33 structures the input test pattern and strobe signals strobe1 through strobeN, and applies the test input pattern to driver 34. In addition, controller 33 also applies strobe signals stobe1 through strobeN and the expected output pattern to respective comparators 351 to 35N (S3).

Driver 34 applies the test input pattern to semiconductor memory device 2, which processes the test input pattern to produce the test output pattern. The test output pattern is then output on a specific pin of semiconductor memory device 2.

Following a first time interval, strobe signal strobe1 is activated and comparator 351 compares the expected output pattern with the test output pattern to produce a first comparative value (S41).

Following a second time interval after the first time interval, strobe signal strobe2 is activated and second comparator 352 compares the expected value with the test output pattern to produce a second comparative value (S42).

This process is repeated for comparators 353 through 35N until "N" comparative values are produced (S4N).

Once steps S41 through S4N are performed to obtain the "N" comparative values, comparative value OR unit 36 logically sums the "N" comparative values to obtain a logically summed comparative value (S5).

Operation determiner 37 analyzes the logically summed comparative value to determine whether semiconductor memory device 2 is defective or not (S6).

Figure 5:
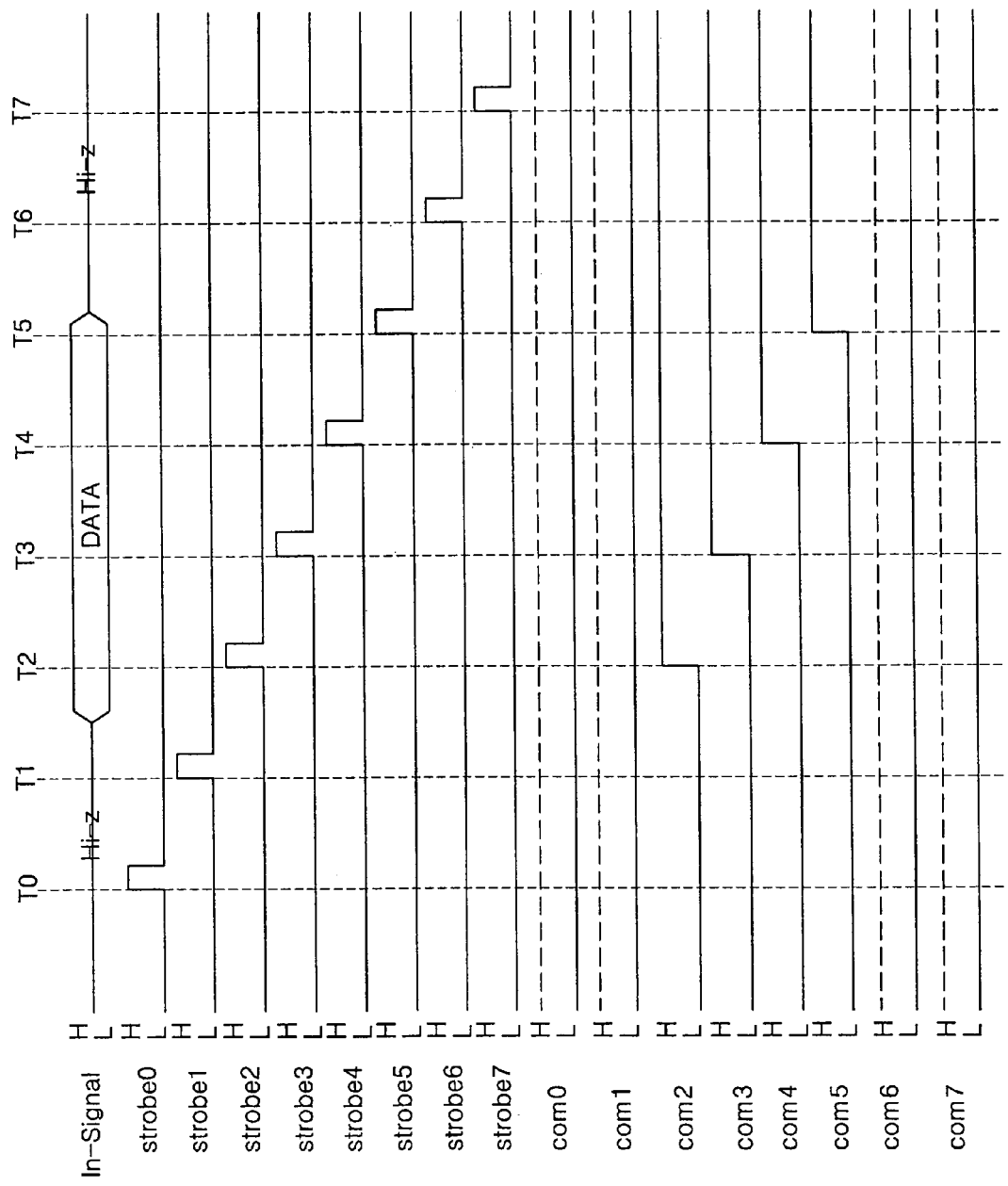
FIG. 5 is a waveform timing diagram illustrating the operation of the test apparatus shown in FIG. 3; and, FIG. 6 is a block diagram of a test apparatus according to another embodiment of the present invention.

FIG. 5 is a waveform timing diagram illustrating the operation of the test apparatus shown in FIG. 3.

In FIG. 5, it is assumed that test apparatus 3 includes eight comparators 351 through 358 and it simultaneously generates eight strobe signals strobe0 to strobe7. When one of comparators 351 through 358 finds the test output pattern to be the same as the expected output pattern, the comparator generates a logical '1'. Otherwise, e.g., if semiconductor memory device 2 outputs a Hi-z signal or the test output pattern and the expected output pattern are different, the comparator outputs a logical '0'. Strobe signals strobe0 through strobe7 each have different phase delays, and a signal "In-Signal" represents the test output pattern output on pins of semiconductor memory device 2 based on the test input pattern. The signal "In-Signal" is a Hi-z signal except in a data generating region denoted "DATA" in FIG. 5. Semiconductor memory device 2 outputs the test output pattern during the data generating region.

First comparator 351 obtains the test output pattern from semiconductor memory device 2 in response to first strobe strobe0 having a first phase delay when it is activated at a first time T0. Comparator 351 then compares the test output pattern to the expected output pattern to produce a first comparative value com0. In this case, since signal In-Signal is a Hi-z signal at time T0, first comparative value com0 is a logical '0'.

Second comparator 352 obtains the test output pattern in response to a second strobe signal strobe1 activated at a second time T1, and also generates a second comparative value com1 as a logical '0'.

Third comparator 353 obtains the test output pattern in response to a third strobe signal strobe2 activated at a third time T2, and generates a third comparative value com2 as a logical '1'.

Fourth through eighth comparators 354 through 358 operate in the same manner as described above to generate comparative values com3 through com5 as logical '1's and comparative values com6 and com 7 as logical '0's. Comparative value OR unit 36 logically sums the first through eighth comparative values to generate a logical '1'.

As described above, test apparatus 3 can precisely test semiconductor memory device 2 even though the data generating region shifts based on the operating conditions of the device. In addition, by providing multiple comparators, test apparatus 3 remarkably reduces the time required to perform the test.

Figure 6:
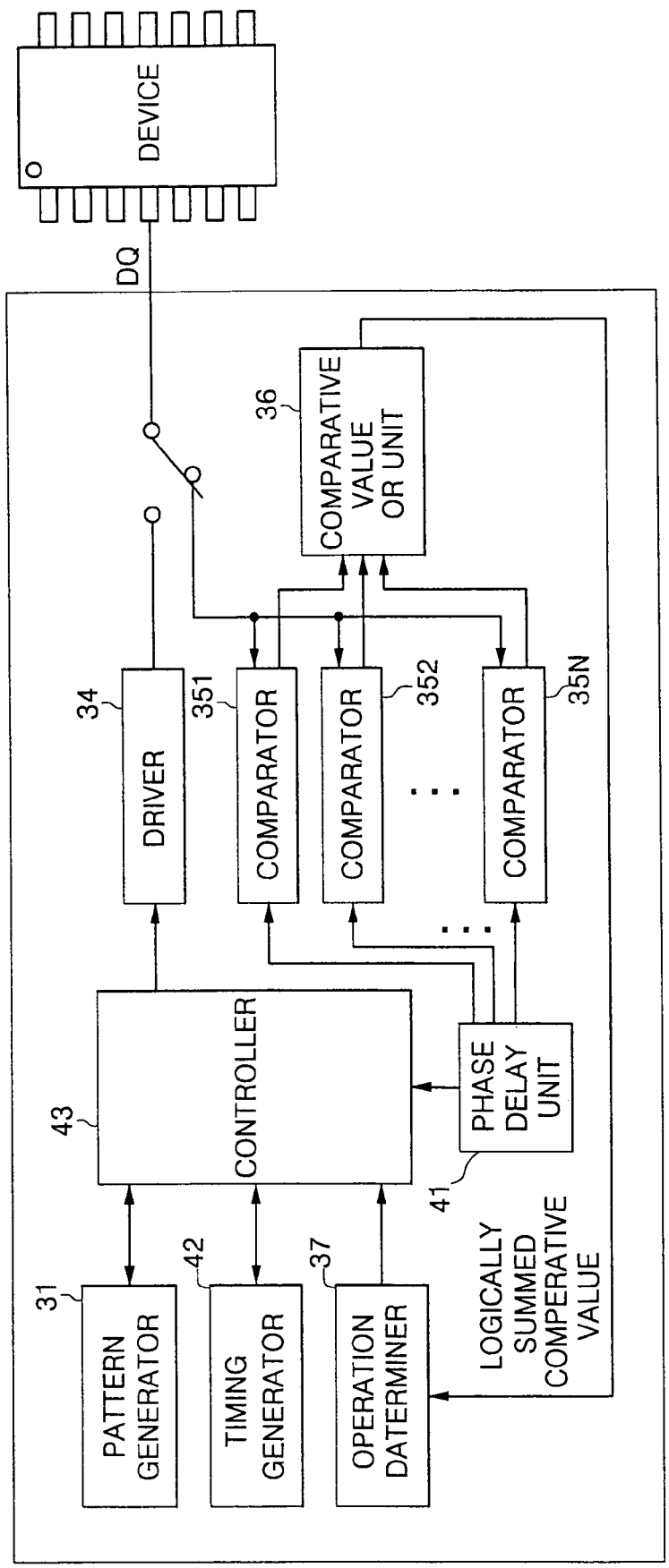

FIG. 6 is a block diagram of a test apparatus for a semiconductor memory device according to another embodiment of the invention.

Referring to FIG. 6, a test apparatus 4 comprises several of the same components as test apparatus 3, including pattern generator 31, driver 34, comparators 35, comparative value OR unit 36, and operation determiner 37. However, test apparatus 4 substitutes a timing generator 42 for timing generator 32, a controller 43 for controller 33, and it further comprises a phase delay unit 41.

The components included in both test apparatus 3 and test apparatus 4 function the same, and therefore additional descriptions thereof will be omitted to avoid redundancy.

Phase delay unit 41 stores information the strobe signals used to test semiconductor memory device 2, such as the number of strobe signals and their associated phase delays. Phase delay unit 41 generates the strobe signals based on the information and applies the strobe signals to controller 43.

For instance, when phase delay unit 41 stores the number eight (8) as the number of strobe signals, and it stores a delay "m" as an interval between the activation of each strobe signal, phase delay unit 41 generates eight strobe signals with a delay "m" between each strobe signal.

Timing generator 42 generates timing signals for driving the test input pattern and it generates a timing signal to drive one of the strobe signals.

Controller 43 provides phase delay unit 41 with information on the number of strobe signals and their associated phase delays for a current test. In addition, when timing generator 42 provides the timing signal to control the timing of one of the strobe signals, controller 43 structures the strobe signal, and then applies the structured strobe signal to phase delay unit 41. Phase delay unit 41 then uses the structured strobe to form the remaining strobe signals.

Test apparatus 4 causes phase delay unit 41 to generate a plurality of strobe signals when timing generator 42 generates a timing signal, so that timing generator 42 and controller 43 do not have to generate a plurality of strobe signals. As a result, timing generator 42 is prevented from being overloaded.

In accordance with the foregoing exemplary embodiments, a test apparatus tests a semiconductor memory device with variable output timing, i.e., a data generating region that shifts, by applying a plurality of phase shifted strobe signals to a plurality of comparators. Using a plurality of comparators in this way reduces the time required to perform the test, thereby enhancing the efficiency of the testing process.

The test apparatus can use various types of strobe signals, such as an edge strobe or a window strobe to obtain the comparative values.

A test apparatus using a window strobe can confirm that the semiconductor memory device normally operates via at least one of the plurality of strobes and inform the operator that the semiconductor memory device operates normally.

The foregoing preferred embodiments are teaching examples. Those of ordinary skill in the art will understand that various changes in form and details may be made to the exemplary embodiments without departing from the scope of the present invention which is defined by the following claims.

What is claimed:

1. A test apparatus for a semiconductor memory device, the test apparatus comprising:
   a comparison unit configured to compare a test output pattern produced by the semiconductor memory device to an expected output pattern generated by the test apparatus in response to a plurality of strobe signals having different phase delays from each other to generate a plurality of comparative values, and logically sum the plurality of comparative values to generate a logically summed comparative value; and
   a controller configured to structure the plurality of strobe signals and transmit the plurality of strobe signals to the comparison unit, and further configured to analyze the logically summed comparative value to determine whether the semiconductor memory device is defective.

2. The test apparatus of claim 1, wherein the comparison unit comprises:
   a plurality of comparators, each configured to receive the expected output pattern and the test output pattern and produce one of the comparative values by comparing the expected output pattern to the test output pattern, wherein each comparator is configured to perform the comparison in response to a corresponding one of the plurality of strobe signals; and
   a comparative value OR unit configured to receive the comparative values from the plurality of comparators, and logically sum the comparative values to generate the logically summed comparative value.

3. The test apparatus of claim 2, wherein each of the comparators outputs a logical '0' whenever the test output pattern comprises a high impedance (Hi-z) signal and whenever the expected output pattern does not match the test output pattern; and wherein each of the comparators outputs a logical '1' whenever the test output pattern matches the expected output pattern.

4. The test apparatus of claim 2, wherein each of the comparators is operatively connected to at least one pin of the semiconductor memory device to receive the expected output pattern.

5. The test apparatus of claim 1, wherein the controller is further configured to structure a test input pattern sent to the semiconductor memory device and processed by the semiconductor memory device to produce the test output pattern.

6. The test apparatus of claim 5, further comprising:
   a pattern generator configured to generate the test input pattern and the expected output pattern;
   a timing generator configured to generate a plurality of timing signals used to drive the test input pattern and the strobe signals; and,
   a driver configured to apply the test input pattern to the semiconductor memory device.

7. The test apparatus of claim 6, wherein the driver is connected to a pin of the semiconductor memory device.

8. The test apparatus of claim 1, wherein the test output pattern has a data generating region, and the test output pattern comprises a high impedance (Hi-z) signal except in the data generating region.

9. The test apparatus of claim 1, further comprising:
   an operation determiner configured to receive the logically summed comparative value and inform the controller whether the semiconductor memory device is defective.

10. A test apparatus for a semiconductor memory device, the test apparatus comprising:
    a comparison unit configured to compare a a test output pattern produced by the semiconductor memory device to an expected output pattern generated by the test apparatus, in response to a plurality of strobe signals having different phase delays from each other to generate a plurality of comparative values, and logically sum the plurality of comparative values to generate a logically summed comparative value;
    a phase delay unit configured to store strobe information, including the number of strobe signals in the plurality of strobe signals, and relative phase delay information for the plurality of strobe signals, and generating the strobe signals based on the strobe information; and
    a controller configured to structure the plurality of strobe signals and transmit the plurality of strobe signals to the comparison unit, and further configured to analyze the logically summed comparative value to determine whether the semiconductor memory device is defective.

11. The test apparatus of claim 10, wherein the comparison unit comprises:
- a plurality of comparators, each configured to receive the expected output pattern and the test output pattern and produce one of the comparative values by comparing the expected output pattern to the test output pattern, wherein each comparator is configured to perform the comparison in response to a corresponding one of the plurality of strobe signals; and
- a comparative value OR unit configured to receive the comparative values from the plurality of comparators, and logically sum the comparative values to generate the logically summed comparative value.

12. The test apparatus of claim 11, wherein each of the comparators outputs a logical '0' whenever the test output pattern comprises a high impedance (Hi-z) signal and whenever the expected output pattern does not match the test output pattern; and
- wherein each of the comparators outputs a logical '1' whenever the test output pattern matches the expected output pattern.

13. The test apparatus of claim 11, wherein each of the comparators is operatively connected to at least one pin of the semiconductor memory device to receive the expected output pattern.

14. The test apparatus of claim 10, wherein the controller is further configured to structure a test input pattern sent to the semiconductor memory device and processed by the semiconductor memory device to produce the test output pattern.

15. The test apparatus of claim 14, further comprising:
- a pattern generator configured to generate the test input pattern and the expected output pattern;
- a timing generator configured to generate a strobe signal and a plurality of timing signals used to drive the test input pattern; and
- a driver configured to apply the test input pattern to the semiconductor memory device;
- wherein the phase delay unit uses the strobe signal generated by the timing generator together with the strobe information to generate the plurality of strobe signals.

16. The test apparatus of claim 15, wherein the driver is connected to a pin of the semiconductor memory device.

17. The test apparatus of claim 10, wherein the plurality of strobe signals have relative phase delays.

18. The test apparatus of claim 10, wherein the test output pattern has a data generating region, and the test output pattern comprises a high impedance (Hi-z) signal except in the data generating region.

19. The test apparatus of claim 10, further comprising:
- an operation determiner configured to receive the logically summed comparative value and inform the controller whether the semiconductor memory device is defective.

* * * * *